United States Patent [19]
Uchiyama

[11] Patent Number: 5,508,545
[45] Date of Patent: Apr. 16, 1996

[54] SEMICONDUCTOR DEVICE INCLUDING A PAIR OF TRANSISTORS HAVING A COMMON CHANNEL REGION, AND METHOD OF MAKING THE SAME

[75] Inventor: Tomoyuki Uchiyama, Tokyo, Japan

[73] Assignee: Nippon Steel Corporation, Tokyo, Japan

[21] Appl. No.: 507,685

[22] Filed: Jul. 25, 1995

Related U.S. Application Data

[63] Continuation of Ser. No. 149,909, Nov. 10, 1993, abandoned.

[30] Foreign Application Priority Data

Nov. 13, 1992 [JP] Japan ..................... 4-328701

[51] Int. Cl.$^6$ ................... H01L 29/76; H01L 29/94; H01L 31/062; H01L 31/113
[52] U.S. Cl. ................... 257/330; 257/332; 257/347
[58] Field of Search ..................... 257/330, 332, 257/334, 347, 401

[56] References Cited

U.S. PATENT DOCUMENTS 4,194,283  3/1980  Hoffman ................... 257/330
4,942,445  7/1990  Baliga et al. ................ 257/330
4,961,100  10/1990 Baliga et al. ................ 257/330

FOREIGN PATENT DOCUMENTS 1-59985  3/1989  Japan.

OTHER PUBLICATIONS

Design of CMOS VLSI, Baifukan, Apr. 1989, pp. 18–21.
Holmes et al, "V–Groove MOS (VMOS) . . . " *Solid State Electronics*, pp. 775–776, 1977.

*Primary Examiner*—Stephen D. Meier
*Attorney, Agent, or Firm*—Pollock, Vande Sande & Priddy

[57] ABSTRACT

A semiconductor device including a pair of transistors, comprises: a semiconductor substrate; a pair of gate electrodes formed in one surface of the semiconductor substrate at first portions thereof, respectively, and spaced from each other with a second portion of the semiconductor substrate therebetween; and two spaced source/drain diffused regions formed in the second portion of the semiconductor substrate and insulated from the gate electrodes. Each pair of transistors is formed of one of the gate electrodes, the source/drain diffused regions which are common to the pair of transistors, and a part of the second portion of the semiconductor substrate disposed between the source/drain diffused regions serving as a channel region common to the pair of transistors.

8 Claims, 3 Drawing Sheets

SEMICONDUCTOR DEVICE INCLUDING A PAIR OF TRANSISTORS HAVING A COMMON CHANNEL REGION, AND METHOD OF MAKING THE SAME

This application is a Continuation of U.S. patent application Ser. No. 08/149,909, filed Nov. 10, 1993 now abandoned.

BACKGROUND OF THE INVENTION

1. Field of the Invention

This invention relates to a semiconductor device including a pair of transistors having a common channel region and to a method of making the same. More particularly, it relates to a semiconductor device including two transistors having a common channel region, which will be useful particularly for constituting an exclusive-OR gate, and a method of making the same.

2. Description of the Related Art

To constitute an exclusive-OR gate, a logic circuit comprising the combination of a plurality of field effect transistors has been employed in the past as described, for example, in "Design of CMOS VLSI" published by Baifukan, April, 1989, page 19. The field effect transistors used in this instance are discrete transistor elements each having different source/drain regions and a different channel region, and are electrically connected with one another by wirings.

However, when the logic circuit is formed by connecting the discrete field effect transistors by the wirings as described above, it involves a problem that the overall occupied area becomes so great that the elements cannot be integrated with a high density.

SUMMARY OF THE INVENTION

The present invention aims at providing a semiconductor device capable of integrating transistor elements in a high density, particularly a semiconductor device useful for constituting an exclusive-OR gate, and a method of fabricating the same.

A semiconductor device according to the present invention comprises a semiconductor substrate, a pair of spaced gate electrodes formed in one surface of the semiconductor substrate as to oppose each other, and two spaced source/drain diffused regions formed in a portion of the semiconductor substrate which extends through a space between the pair of the gate electrodes, and insulated from the gate electrodes, wherein each of a pair of transistors is formed of one of the gate electrodes, the source/drain regions common to the pair of transistors and a part of the portion of the semiconductor substrate disposed between the source/drain regions and facing the electrode to provide a channel region common to the pair of the transistors.

A method of making a semiconductor device according to the present invention comprises the steps of introducing oxygen into a semiconductor substrate having a first conductivity type to form a layer of a semiconductor oxide film extending substantially parallel to a surface of the substrate at a predetermined depth from the surface, forming a pair of elongated grooves which are spaced from and parallel to each other, on the surface of the semiconductor substrate so as to expose the semiconductor oxide film at the bottom of the grooves, forming an insulating film covering the inside surfaces of the pair of the grooves, filling the pair of the grooves with an electrically conductive material, and forming two diffused regions spaced from each other by a predetermined distance in a portion of the semiconductor substrate disposed between the pair of the grooves, by diffusing impurities of a second conductivity type different from the first conductivity type.

The semiconductor device according to the present invention uses a P-type semiconductor substrate, for example. Inputs of two values such as a low potential of 0 V (as a logic value "0") and a high potential of +5 V (as a logic value "1") are selectively applied to the pair of gate electrodes. Then, when both of the gate electrodes are at the low potential or at the high potential, a potential difference does not occur in a region of the P-type semiconductor substrate between the pair of N-type diffused regions, for example. Accordingly, no channel is formed at the region between the pair of the diffused regions so that it is not rendered conductive. Therefore, no output is taken out through these diffused regions used as source/drain regions, and the logic value of the output becomes "0". When only one of the gate electrodes is at the high potential, on the other hand, a channel is formed at a portion near the gate electrode having the high potential and the region between the pair of the diffused regions becomes conductive. Accordingly, the output can be obtained through these regions, and the logic value of the output becomes "1". In other words, a logic operation of exclusive-OR can be obtained by use of the semiconductor device according to the present invention.

DESCRIPTION OF THE PREFERRED EMBODIMENTS

Figure 1:
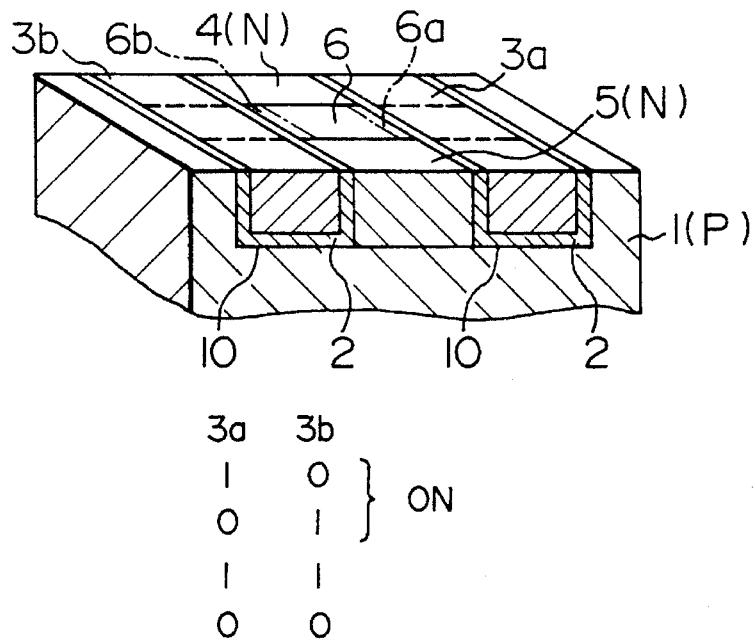
FIG. 1 is a partially broken perspective view showing the structure of a semiconductor device according to a first embodiment of the present invention.

FIG. 1 shows the structure of a semiconductor device according to the first embodiment of the present invention. In the drawing, reference numeral 1 denotes a P-type silicon substrate. A pair of elongated grooves 10 are formed on one surface of this substrate in parallel with each other with a predetermined space between them. A silicon dioxide film 2 is formed on the inside surface of each groove by a thermal oxidation process, and a refractory metal such as tungsten silicide W—Si or a polysilicon including impurities is buried into the grooves so as to form gate electrodes 3a and 3b.

N-type diffused layers 4 and 5 are formed at a portion of the silicon substrate between the gate electrodes 3a and 3b with a predetermined distance between them. In other words, these N-type diffused layers 4 and 5 are formed in a region across the space between the gate electrodes 3a and 3b, and function as source/drain regions common to a pair of transistors having the gate electrodes 3a, 3b, respectively. A portion of the P-type silicon substrate 1 disposed between these N-type diffusion layers 4, 5 serves as a channel region 6 common to the pair of transistors.

Incidentally, among each of the gate electrodes 3a, 3b, the portion which is opposite to the channel region 6 disposed between two dashed lines in FIG. 1 provides a function of the gate of one of the transistors, and the remaining portion is used as a wiring for electrical connection of the gate electrode.

Next, the operation of this semiconductor device will be explained.

It is assumed that a high potential of +5 V applied to each gate electrode 3a, 3b is a logic value "1" and a low potential of 0 V applied to each gate electrode 3a, 3b is a logic value "0" and that an output extracted through the region between the pair of N-type diffused layers 4 and 5 used as the source/drain regions takes logic values "1" and "0" when the region is conductive and nonconductive, respectively.

When a high potential (the logic value "1") is applied in this instance to one of the gate electrodes 3a, a low potential (the logic value "0") to the other gate electrode 3b and voltages 0 V and +5 V are applied to the source and the drain, respectively, a potential difference occurs in the channel region 6 of the P-type silicon substrate 1 disposed between the N-type diffused layers 4 and 5 due to these inputs, and a channel 6a is induced in a portion near the gate electrode 3a. In consequence, the channel region 6 between the N-type diffused layers 4 and 5 used as the source/drain regions becomes conductive, and the output of the logic value "1" can be obtained. This also holds true in the case where the potentials applied to the gate electrodes 3a, 3b are reversed. In such a case, a channel 6b is induced in a portion near the gate electrode 3b, so that the channel region 6 between the N-type diffused layers 4 and 5 also becomes conductive and the output of the logic value "1" can be obtained.

In contrast, when the same potential is applied to the pair of gate electrodes 3a, 3b, a potential difference does not occur in the channel region 6 of the P-type silicon substrate 1. Accordingly, the channel is not formed and the channel region between the N-type diffused layers 4 and 5 does not become conductive. Therefore, the logic value of the output in this case is "0".

As described above, by using the semiconductor device according to this embodiment, the output of the logic value "1" can be obtained when only one of the inputs has the logic value "1", and the output of the logic value "0" can be obtained when both the inputs have the logic value "1" or the logic value "0". In other words, an exclusive-OR operation can be obtained.

Moreover, in the semiconductor device according to this embodiment, the pair of N-type diffused layers 4 and 5 are formed on the P-type silicon substrate 1 between the two gate electrodes 3a and 3b, and are used as the source/drain regions common to the transistors having the gate electrodes 3a and 3b, respectively. Accordingly, a device for accomplishing the logic operation of the exclusive-OR can be obtained with an extremely compact structure.

In the semiconductor device according to this embodiment, further, the gate electrodes 3a and 3b are formed to be buried into the P-type silicon substrate 1, and the channel layer is formed at the side of each gate electrode 3a, 3b to extend in a direction vertical to the main surface of the P-type silicon substrate 1 (that is, the direction of depth). Accordingly, the two gate electrodes 3a, 3b can be formed relatively closely to each other and the area occupied by the device can be reduced. In other words, an integration density can be improved.

Furthermore, the gate electrodes may be formed on an N-type silicon substrate 1.

Next, the semiconductor device according to the second embodiment of the present invention will be explained together with the method of manufacturing thereof with reference to FIGS. 2A to 2G.

Figure 2A:
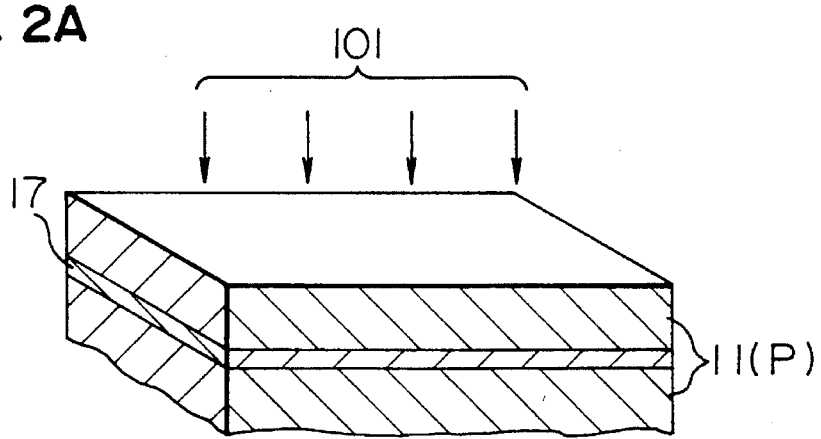
FIGS. 2A to 2G are partially broken perspective views for explaining a fabrication method of a semiconductor device according to a second embodiment of the present invention.

In this embodiment, oxygen 101 is injected by ion implantation into a P-type silicon substrate 11 to a predetermined depth by a SIMOX separation by Implanted Oxygen process as shown in FIG. 2A, and heat treatment is then carried out so as to form a silicon dioxide film 17 at a predetermined depth 0.1 to 0.2 µm, for example, in the P-type silicon substrate 11.

Figure 2B:
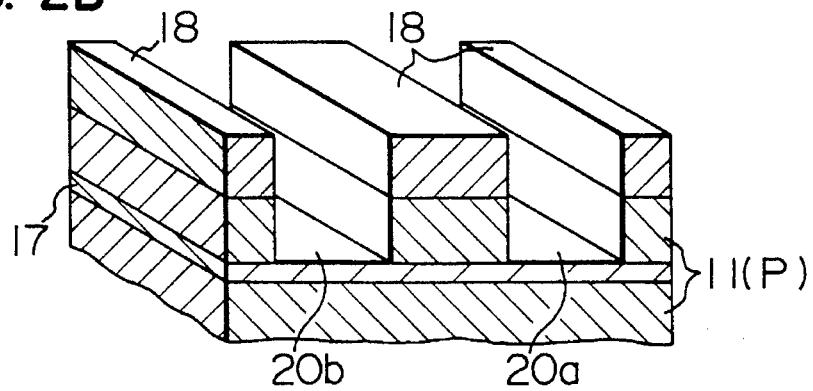

Next, as shown in FIG. 2B, a resist 18 is coated on the entire surface of the P-type silicon substrate 11. After this resist 18 is patterned as shown in the drawing, anisotropic etching of the P-type silicon substrate 11 is effected using this resist 18 as a mask. This etching is carried out until a silicon dioxide film 17 is exposed, and a pair of parallel grooves 20a, 20b is formed in the P-type silicon substrate 11. Since the silicon dioxide film 17 functions as an etching stopper, the grooves 20a and 20b can be formed with highly accurate dimensions.

Figure 2C:
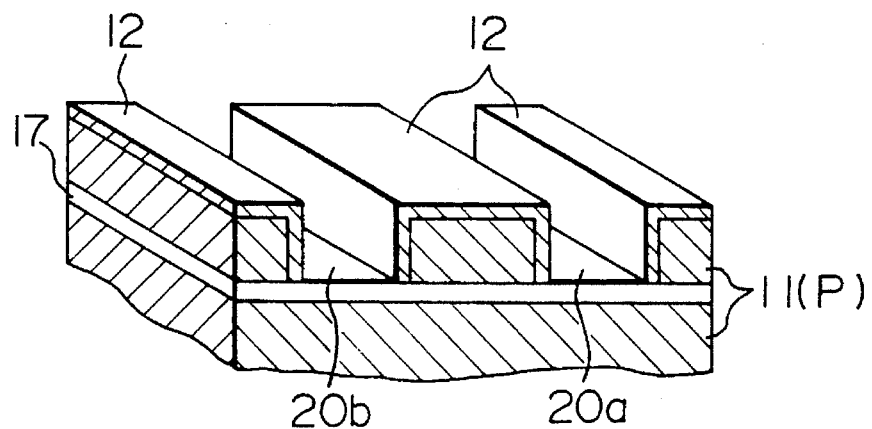

After the resist 18 has been removed as shown in FIG. 2C, thermal oxidation is effected so as to form a silicon dioxide film 12 on the entire exposed surface of the P-type silicon substrate 11, that is, the entire surface of the P-type silicon substrate 11 inclusive of the inside surface of each groove 20a, 20b.

Figure 2D:
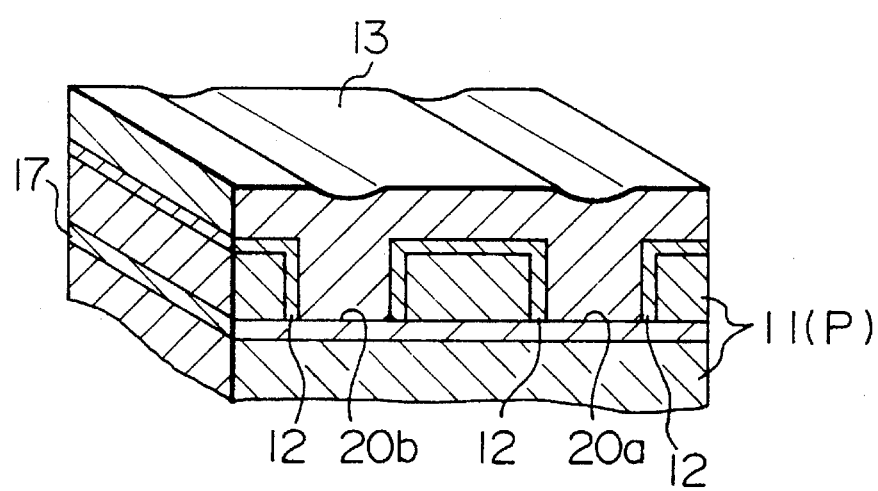

Next, as shown in FIG. 2D, each of the grooves 20a and 20b is buried with a refractory metal 13 such as tungsten silicide until its surface becomes substantially flat with the surface of the substrate.

Figure 2E:
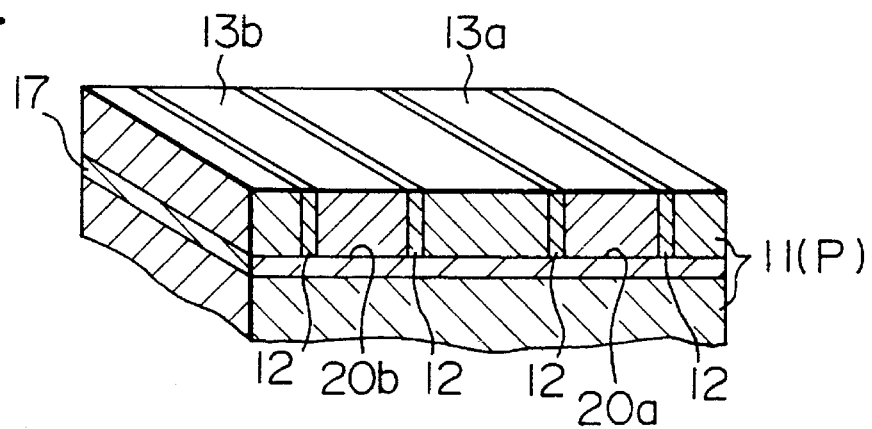

Next, the refractory metal 13 is etched back until the refractory metal 13a, 13b remains only inside the grooves 20a, 20b and is removed at the upper surface of the P-type silicon substrate 11, as shown in FIG. 2E.

Alternatively, a polysilicon including impurities may be used in place of the refractory metal.

Figure 2F:
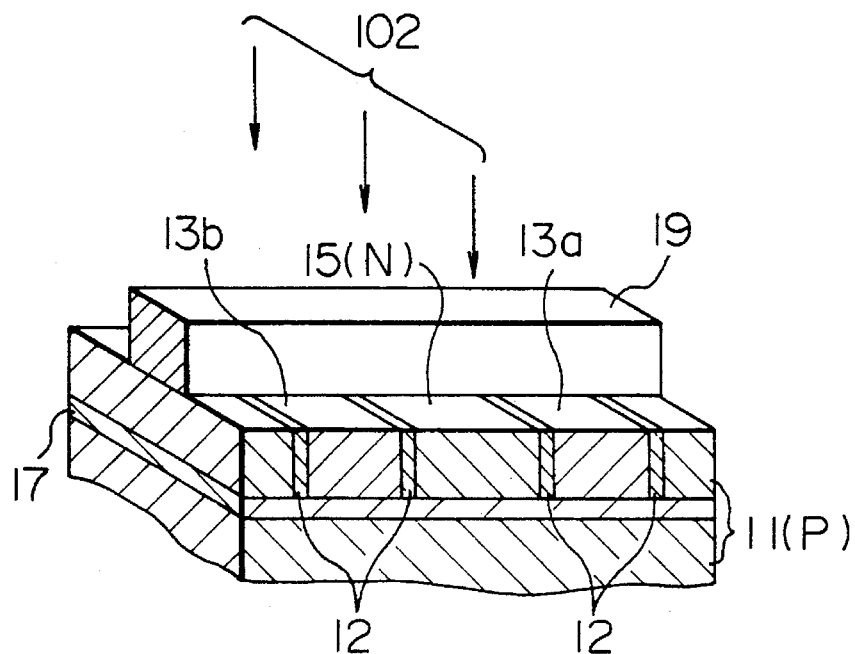

After a resist 19 is coated on the entire surface as shown in FIG. 2F, patterning is carried out as shown in the drawing, and an N-type impurity 102 is implanted into the P-type silicon substrate 1 at a portion between the grooves 20a and 20b using the resist 19 as the mask.

Figure 2G:
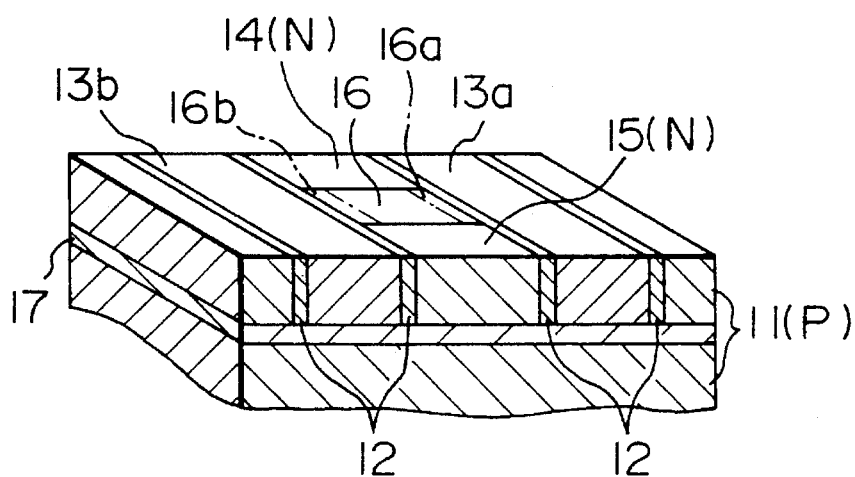

As a result, a pair of N-type diffused layers 14 and 15 and a P-type region 16 disposed between them are formed on the P-type silicon substrate 11 at a portion disposed between the refractory metals 13a and 13b and on the silicon dioxide film 17 as shown in FIG. 2G. There is thus fabricated a semiconductor device including a pair of transistors which use these N-type diffused layers 14, 15 and the P-type region 16 as the source/drain regions and the channel region common to the transistors, and the pair of refractory metals 13a, 13b as a pair of gate electrodes, respectively.

The operation of the semiconductor device thus fabricated is the same as that of the first embodiment described already. In other words, channels 16a and 16b are selectively formed in the P-type region 16 disposed between the pair of N-type diffused regions 14 and 15 used as the source/drain regions in accordance with the polarities of the inputs to the gate electrodes, and the logic operation of the exclusive-OR can be obtained.

Incidentally, the dimension of each portion is as follows, for example. The length of each gate electrode measured in a direction in which the gate electrodes extend in parallel with each other, is 0.5 µm, the distance between the gate electrodes is 0.5 µm, the length of the channel region between the source and the drain is equal to the length of each gate electrode and is 0.5 µm. The thickness of the gate electrode measured in a direction along the surface of the substrate is determined in accordance with a wiring resistance (which varies with circuit design) of the gate electrode.

According to the structure of this embodiment, the active region of the device and the P-type silicon substrate 11 are separated from each other by the silicon dioxide film 17. Accordingly, a stable device operation can be obtained.

In the embodiment described above, the grooves 20a and 20b are formed by etching the P-type silicon substrate 11, but they may also be formed on an epitaxial layer by utilizing epitaxial growth of silicon. For example, the grooves are formed by forming a silicon dioxide film into a desired pattern of grooves on a P-type silicon substrate, growing epitaxially and selectively silicon by utilizing this silicon dioxide film as a mask so as to form the grooves at portions of the silicon substrate where no silicon epitaxial layer is grown.

I claim:

1. A semiconductor device including:
   a) a first transistor which comprises:
      a gate electrode region formed in a surface of a semiconductor substrate and insulated from said substrate by an insulating film;
      a pair of diffused regions formed in the surface of said semiconductor substrate at its portions disposed at one side of said gate electrode region and spaced from each other by a predetermined distance;
      a substrate region formed in the surface of said semiconductor substrate and having three sides adjacent to said gate electrode region and said pair of diffused regions, respectively; and
   b) a second transistor formed in said semiconductor substrate so as to be symmetric with said first transistor with respect to a line along which said pair of diffused regions is aligned, said substrate region being common to said first and second transistors, wherein said first and second transistors comprise only one said pair of diffused regions which is common to said first and second transistors.

2. A semiconductor device including:
   a) a first transistor which comprises:
      a gate electrode region formed in a surface of a semiconductor substrate and insulated from said substrate by an insulating film;
      a pair of diffused regions formed in the surface of said semiconductor substrate at its portions disposed at one side of said gate electrode region and spaced from each other by a predetermined distance;
      a substrate region formed in the surface of said semiconductor substrate and having three sides adjacent to said gate electrode region and said pair of diffused regions, respectively;
      wherein said first gate electrode region and said pair of diffused regions are formed, respectively, in a first portion of said semiconductor substrate and a second portion thereof adjacent to said first portion, and,
   b) a second transistor having a second gate electrode region formed in a third portion spaced from said first portion with the second portion therebetween and wherein said second gate electrode region is adjacent to said pair of diffused regions with an insulating film interposed therebetween, said first and second transistors comprising only one said pair of diffused regions which is common to said first and second transistors.

3. A semiconductor device comprising:
   a semiconductor substrate;
   a gate electrode formed in one surface of said semiconductor substrate and extending in a longitudinal direction along said one surface of said semiconductor substrate;
   an insulating film formed to insulate said gate electrode from said semiconductor substrate; and
   a source region, a channel region adjacent to said source regions, and a drain region adjacent to said channel region formed in said one surface of said semiconductor substrate in that order along said longitudinal direction and insulated from said gate electrode by said insulating film, wherein only one said source region and only one said drain region are common to a pair of transistors forming said semiconductor device.

4. A semiconductor device according to claim 3, wherein said gate electrode is formed in a groove formed in said one surface of said semiconductor substrate, and wherein an inner wall and a bottom wall of said groove are covered by said insulating film.

5. A semiconductor device according to claim 3, wherein said gate electrode is formed of a conductive material embedded into a groove formed in said one surface of said semiconductor substrate.

6. A semiconductor device for performing an exclusive-OR logic operation, comprising:
   a pair of transistors which includes
   a) a semiconductor substrate;
   b) a pair of insulated gate electrodes located in said semiconductor substrate, wherein each transistor comprises one gate electrode of said pair of electrodes, said one gate electrode being spaced apart from the remaining gate electrode of said pair;
   c) a source region and a drain region located between gate electrodes of said pair and spaced apart from each other, wherein said pair of transistors comprises only one source region and only one drain region which are common to said pair of transistors; and
   d) a channel region being common to said pair of transistors and located between said source and drain regions for providing a conduction channel therebetween when a first voltage level applied to one gate electrode is different than a second voltage level applied to the remaining gate electrode of said pair.

7. A semiconductor device according to claim 6, wherein said semiconductor substrate is of a P-type and said source and drain regions are of an N-type.

8. A semiconductor device according to claim 6, wherein said pair of gate electrodes comprise an electrically conductive material located in a pair of substantially parallel grooves in said semiconducter substrate, each groove having inner side surfaces and a bottom surface covered with an insulating material disposed between said semiconductor substrate and said electrically conductive material.

* * * * *